United States Patent [19]
Köhler et al.

[11] Patent Number: 5,991,983
[45] Date of Patent: Nov. 30, 1999

[54] SECURING DEVICE FOR ASSEMBLY BRACKET OF PLUG-IN CARDS AND STANDARD FLAT COMPONENTS

[75] Inventors: Friedrich Köhler, Meitingen; Dietmar Mysz, Augsburg, both of Germany

[73] Assignee: Siemens Nixdorf Informationssysteme Aktiengesellschaft, Paderborn, Germany

[21] Appl. No.: 09/142,349

[22] PCT Filed: Mar. 12, 1997

[86] PCT No.: PCT/DE97/00492

§ 371 Date: Sep. 8, 1998

§ 102(e) Date: Sep. 8, 1998

[87] PCT Pub. No.: WO97/34216

PCT Pub. Date: Sep. 18, 1997

[30] Foreign Application Priority Data

Mar. 12, 1996 [DE] Germany ............... 296 04 610 U

[51] Int. Cl.6 .................................. G06F 1/18; H05K 7/14
[52] U.S. Cl. ......................... 24/573.1; 361/807; 361/825
[58] Field of Search ............................... 24/573.1, 573.7, 24/297, 336, 555; 174/138 G; 361/807, 809, 825; 248/497, 220.22, 220.31, 221.11, 229.1, 229.16, 507, 508

[56] References Cited

U.S. PATENT DOCUMENTS

| | | | |
|---|---|---|---|
| 4,180,247 | 12/1979 | Pfarr, Jr. ........................... | 24/573.1 X |
| 4,708,895 | 11/1987 | Mizusawa ......................... | 24/573.1 X |
| 4,754,533 | 7/1988 | Awakowicz et al. ............... | 24/297 X |
| 4,873,395 | 10/1989 | Mast . | |
| 5,304,735 | 4/1994 | Earl et al. ......................... | 24/555 X |
| 5,694,291 | 12/1997 | Feightner ........................ | 361/825 X |
| 5,757,618 | 5/1998 | Lee .................................. | 361/825 X |

FOREIGN PATENT DOCUMENTS 44 03 907 A1  10/1995  Germany .

*Primary Examiner*—James R. Brittain
*Assistant Examiner*—Robert J. Sandy
*Attorney, Agent, or Firm*—Hill & Simpson

[57] ABSTRACT

Serving to secure the securing flange (4) lying against an angled support surface (5) of the housing wall (1) and correspondingly angled is a clamp device (6). The clamp device has a bow-like spring element which is supported with the bow ends on the housing wall (1) and is capable of snapping in between the securing flange (4) of the assembly bracket (3) and a catch element (7) provided on the housing wall (1).

5 Claims, 2 Drawing Sheets

SECURING DEVICE FOR ASSEMBLY BRACKET OF PLUG-IN CARDS AND STANDARD FLAT COMPONENTS

BACKGROUND OF THE INVENTION

The invention relates to a securing device.

Standard flat components, in particular the plug-in cards used in computer technology, are usually mounted with the aid of assembly brackets at appropriately designed mounting locations. Secured to these assembly brackets there is in each case at least one plug-in connector, which establishes the connection of the plug-in card to external terminals. The housing wall therefore has at the mounting locations in each case slot-like clearances, which are covered by the respective assembly bracket. Also provided on the assembly bracket is a securing flange, which is attached at right angles, lies snugly against a correspondingly angled support surface of the housing wall and is releasably fixed there by means of a screw or clamp connection.

By way of example, German reference DE 44 03 907 A1 discloses a securing device in the form of a clamping strip which reaches over all the insertable flat components or their assembly brackets and, in the fitted state, fixes all the plug-in cards and, in the releasing state, releases all the plug-in cards, and which has flexible regions which are assigned to the individual plug-in cards. A disadvantage in this case is that, irrespective of the number of mounting locations occupied, a clamping strip wide enough to cover all the mounting locations is always required and that, when retrofitting or exchanging, the securement has to be temporarily loosened for all the other, in fact unconcerned, flat components.

SUMMARY OF THE INVENTION

The present invention is thus based on the object of securing the assembly bracket of plug-in cards a device which is as simple as possible and also can be handled as easily as possible, permitting an individual reliable securement on the housing of each individual flat component.

In general terms the present invention is a securing device for the assembly bracket of standard flat components which are releasably secured by the assembly bracket at mounting locations in the form of slot-like clearances in a housing wall of a data-processing device. The securing flange of the assembly bracket lies against an angled support surface of the housing wall and is correspondingly angled. The securing flange can be fixed by means of a clamp device. Each securing flange is assigned an individual clamp device. The spring element of a respective clamp device is supported with the bow ends of the housing wall. The spring element is capable of snapping in between the securing flange of the assembly bracket and in each case a catch element provided on the housing wall.

Advantageous developments of the present invention are as follows.

The clamp device consists of flexible plastic.

The clamp device has on the side facing the securing flange an centering pin, which enters through a U-shaped notch in the assembly bracket into a hole-like clearance in the support surface of the housing wall.

The side of the clamp device facing the securing flange is designed as a surface which is plane-parallel to the securing flange.

A gripping element which projects in a nose-like manner is provided at the region of the bow-like spring element facing away from the securing flange.

BRIEF DESCRIPTION OF THE DRAWINGS

The features of the present invention which are believed to be novel, are set forth with particularity in the appended claims. The invention, together with further objects and advantages, may best be understood by reference to the following description taken in conjunction with the accompanying drawings, in the several Figures of which like reference numerals identify like elements, and in which:

DESCRIPTION OF THE PREFERRED EMBODIMENTS

Figure 1:
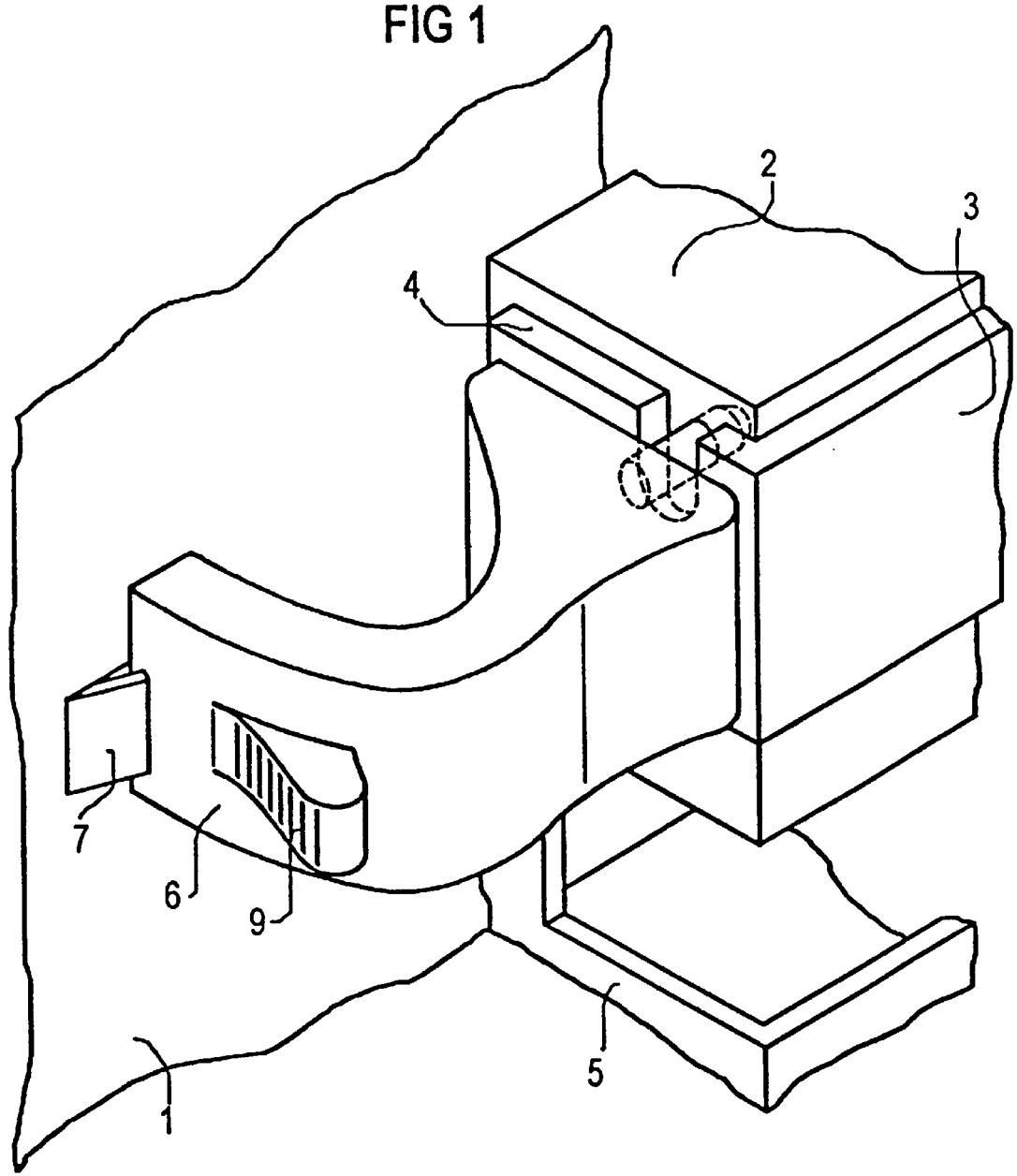
FIG. 1 shows a cutout from a housing wall of a computer housing with a securing device according to the invention in a perspective representation.

FIG. 1 shows a cutout of a housing rear wall 1 of a PC housing, which has an approximately rectangular recess 2 in the region of two mounting locations for plug-in cards. Secured to the mounting locations, arranged parallel to one another in the form of slot-like clearances, there are respectively L-shaped assembly brackets 3 of a plug-in card or, if the mounting locations are not occupied, covering brackets identical in design to these assembly brackets. The securement of the assembly bracket 3, or of the identical covering bracket, takes place at its right-angled securing flange 4, which lies snugly against a lateral supporting wall 5 of the housing wall 1, formed by the recess 2. As a substitute for the screw connection usually provided, there is provided a clamp device 6, which comprises a bow-shaped spring element, this spring element being supported with the bow ends on the housing wall 1 and being capable of snapping in between the securing flange 4 on the one hand and a catch element 7, provided on the housing wall 1, on the other hand. Provided for example as the catch element 7 is a sheet-metal lug bent out from the housing wall 1.

Figure 2:
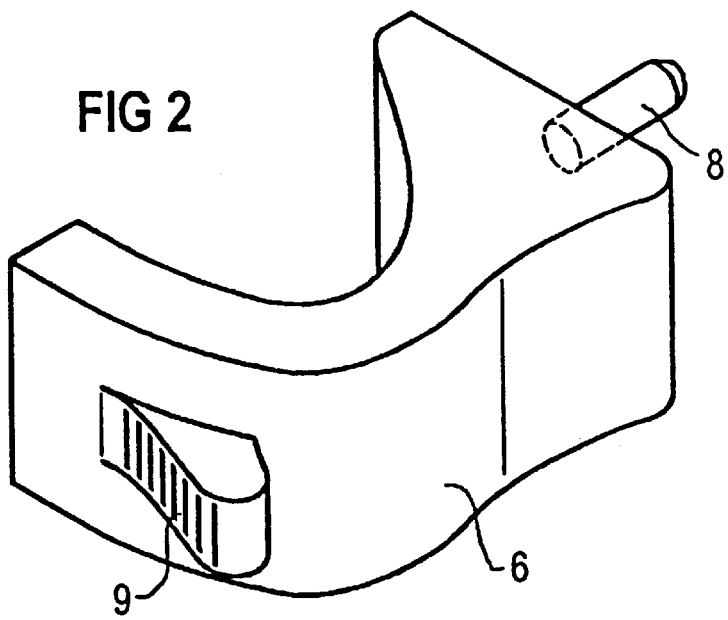
FIG. 2 shows the clamping element as a component part of the device according to FIG. 1, FIGS. 3, 4 show the securing device according to FIG. 1 at the time of assembly or after assembly.

Details of the clamp device 6 used in the securing device according to FIG. 1 are revealed by the representation in FIG. 2. This clamp device, consisting for example of plastic, has on the side facing the securing flange 4 of the assembly bracket 3 (see FIG. 1) a centering pin 8, which enters through a U-shaped notch in the assembly bracket into a hole-like clearance in the support surface 5 of the housing wall 1, whereby the assembly bracket is additionally fixed by means of the clamping. The side of the clamp device facing the securing flange 4 has a surface which is plane-parallel to the securing flange.

Figure 3:
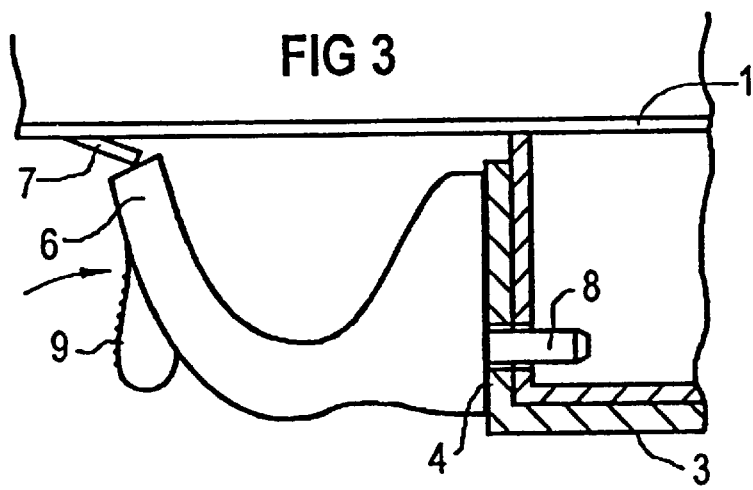
Figure 4:
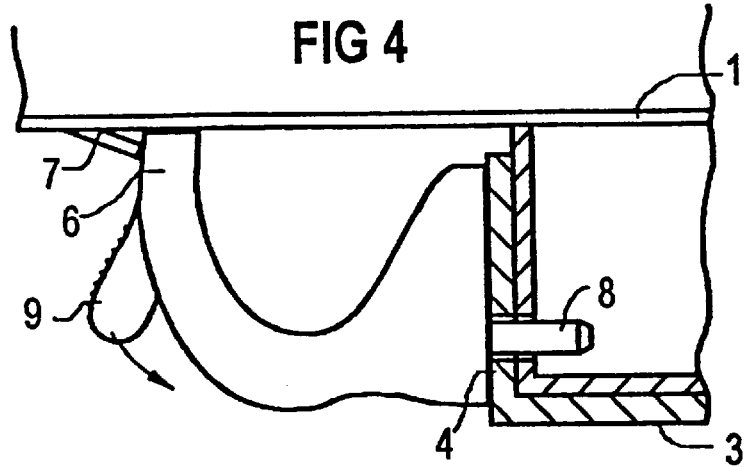

The assembly or final fixing of the clamp device can be seen from FIGS. 3 and 4. Serving as an assembly aid is a gripping element 9 which projects in a nose-like manner and is formed on at the region of the bow-like spring element facing away from the securing flange. Slight pressure applied by the thumb in the direction of the securing flange 4 causes the spring element, preferably consisting of flexible plastic, to be compressed to the extent that the bow facing away from the securing flange enters behind the catch element 7 in the housing wall 1 and locks when the gripping element 9 is released. FIG. 4 shows the clamp device in the assembled state, the spring bow being clamped between the securing flange 4 and the catch 7 and fixed in the correct position by the centering pin 8, entering into the supporting wall 5.

The invention is not limited to the particular details of the apparatus depicted and other modifications and applications are contemplated. Certain other changes may be made in the above described apparatus without departing from the true spirit and scope of the invention herein involved. It is intended, therefore, that the subject matter in the above depiction shall be interpreted as illustrative and not in a limiting sense.

We claim:

1. A securing device comprising:

an assembly bracket of standard flat components which are releasably secured by the assembly bracket at mounting locations in the form of slot-like clearances in a housing wall of a data-processing device, the housing wall having at least one catch element;

the assembly bracket having at least one securing flange lying against an angled support surface of the housing wall and correspondingly angled;

at least one clamp device having a spring element which is supported with bow ends on the housing wall, the spring element being capable of snapping in between the securing flange of the assembly bracket and the catch element on the housing wall, a respective securing flange having associated therewith a respective clamp device and catch element.

2. The securing device as claimed in claim 1, wherein the clamp device consists of flexible plastic.

3. The securing device as claimed in claim 1, wherein the securing device further comprises, a gripping element, which projects in a nose-like manner, at a region of a bow-like spring element facing away from the securing flange.

4. The securing device as claimed in claim 1, wherein a side of the clamp device facing the securing flange is a surface which is plane-parallel to the securing flange.

5. A securing device comprising:

an assembly bracket of standard flat components which are releasably secured by the assembly bracket at mounting locations in the form of slot-like clearances in a housing wall of a data-processing device, the housing wall having at least one catch element;

the assembly bracket having at least one securing flange lying against an angled support surface of the housing wall and correspondingly angled;

at least one clamp device having a spring element which is supported with bow ends on the housing wall, the spring element being capable of snapping in between the securing flange of the assembly bracket and the catch element on the housing wall, a respective securing flange having associated therewith a respective clamp device and catch element;

the clamp device having on a side facing the securing flange a centering pin, which is adapted to enter through a U-shaped notch in the assembly bracket into a hole-like clearance in the support surface of the housing wall.

* * * * *